(12) United States Patent
Tang et al.

(10) Patent No.: US 12,302,724 B2
(45) Date of Patent: May 13, 2025

(54) ARRAY SUBSTRATE, METHOD FOR MANUFACTURING SAME, DISPLAY PANEL, AND DISPLAY DEVICE

(71) Applicants: Ordos Yuansheng Optoelectronics Co., Ltd., Ordos (CN); BOE Technology Group Co., Ltd., Beijing (CN)

(72) Inventors: Liang Tang, Beijing (CN); Liangliang Liu, Beijing (CN); Liman Peng, Beijing (CN); Yan Wu, Beijing (CN); Nini Bai, Beijing (CN); Qiang Chen, Beijing (CN); Xu Liu, Beijing (CN); Guodong Jing, Beijing (CN); Qianqian Zhang, Beijing (CN); Zhiyong Xue, Beijing (CN); Qiang Guo, Beijing (CN); Guofang Xu, Beijing (CN); Zihua Li, Beijing (CN); Qiang Wang, Beijing (CN); Ruiqing Zhang, Beijing (CN); Xudong Wang, Beijing (CN)

(73) Assignees: Ordos Yuansheng Optoelectronics Co., Ltd., Inner Mongolia (CN); BOE Technology Group Co., Ltd., Beijing (CN)

(*) Notice: Subject to any disclaimer, the term of this patent is extended or adjusted under 35 U.S.C. 154(b) by 443 days.

(21) Appl. No.: 17/771,756

(22) PCT Filed: Mar. 9, 2021

(86) PCT No.: PCT/CN2021/079818
§ 371 (c)(1),
(2) Date: Apr. 25, 2022

(87) PCT Pub. No.: WO2021/213041
PCT Pub. Date: Oct. 28, 2021

(65) Prior Publication Data
US 2022/0416007 A1 Dec. 29, 2022

(30) Foreign Application Priority Data

Apr. 20, 2020 (CN) .......................... 202010311566.1

(51) Int. Cl.
*H10K 59/131* (2023.01)
*H10K 59/12* (2023.01)

(52) U.S. Cl.
CPC ..... *H10K 59/1315* (2023.02); *H10K 59/1201* (2023.02)

(58) Field of Classification Search
None
See application file for complete search history.

(56) References Cited

U.S. PATENT DOCUMENTS 6,500,700 B1  12/2002  Kawai
2020/0373373 A1  11/2020  Zhang et al.

FOREIGN PATENT DOCUMENTS

CN  107167970 A  9/2017
CN  109449182 A  3/2019
(Continued)

OTHER PUBLICATIONS

CN202010311566.1 first office action.

*Primary Examiner* — Anthony Ho
(74) *Attorney, Agent, or Firm* — IPro, PLLC

(57) ABSTRACT

Provided is a method for manufacturing an array substrate. The method includes: providing a base substrate with a conductive pattern layer, wherein the base substrate is provided with a display region and a peripheral region disposed around the display region, wherein the conductive pattern layer includes a plurality of conductive lines disposed in the peripheral region; forming an electrode material film layer on the conductive pattern layer; forming a mask layer on the electrode material film layer, wherein the mask layer includes a plurality of electrode layer patterns disposed (Continued)

in the display region and protection patterns disposed above the conductive lines; and etching the electrode material film layer and removing the mask layer.

15 Claims, 7 Drawing Sheets

(56) References Cited

FOREIGN PATENT DOCUMENTS

| | | |
|---|---|---|
| CN | 109491159 A | 3/2019 |
| CN | 111211137 A | 5/2020 |
| CN | 111509008 A | 8/2020 |
| JP | 2001133805 A | 5/2001 |

ARRAY SUBSTRATE, METHOD FOR MANUFACTURING SAME, DISPLAY PANEL, AND DISPLAY DEVICE

CROSS-REFERENCE TO RELATED APPLICATION

This application is a U.S. national phase application based on PCT/CN2021/079818, filed on Mar. 9, 2021, which claims priority to the Chinese Patent Application No. 202010311566.1, filed on Apr. 20, 2020 and entitled "ARRAY SUBSTRATE, METHOD FOR MANUFACTURING SAME, DISPLAY PANEL, AND DISPLAY DEVICE." the contents of which are incorporated herein by reference in their entirety.

TECHNICAL FIELD

The present disclosure relates to the technical field of display devices, and in particular, relates to an array substrate, a method for manufacturing the same, a display panel, and a display device.

BACKGROUND

With the continuous development of display technologies, organic light-emitting diode (OLED) displays have become mainstream in the market. An OLED display generally includes an array substrate, a cover plate, and an OLED unit disposed between the array substrate and the cover plate, and the array substrate is provided with a plurality of thin film transistors.

SUMMARY

Embodiments of the present disclosure provide an array substrate, a method for manufacturing the same, a display panel, and a display device. The technical solutions are described as below.

In a first aspect of the embodiments of the present disclosure, a method for manufacturing an array substrate is provided. The method includes:
  providing a base substrate provided with a conductive pattern layer, wherein the base substrate is provided with a display region and a peripheral region disposed around the display region, the conductive pattern layer includes a plurality of conductive structures disposed in the peripheral region, and the conductive structure is provided with a first surface in contact with the base substrate, a second surface distal from the base substrate, and a side surface configured to connect the first surface and the second surface;
  forming an electrode material film layer on the conductive pattern layer;
  forming a mask layer on the electrode material film layer, wherein the mask layer includes a plurality of electrode layer patterns disposed in the display region and protection patterns disposed above the conductive structures, wherein the protection patterns at least cover part of the side surface; and
  etching the electrode material film layer and removing the mask layer.

In some embodiments, providing the base substrate with the conductive pattern layer includes:
  providing a base substrate, forming a metal layer on the base substrate; and acquiring a conductive pattern layer by patterning the metal layer, wherein the conductive pattern layer further includes a plurality of source electrodes and a plurality of drain electrodes that are all disposed in the display region.

In some embodiments, etching the electrode material film layer includes:
  etching the electrode material film layer with an etching solution to form a plurality of electrodes in the display region, wherein the conductive pattern layer includes a first material layer, a second material layer and a third material layer that are sequentially stacked along a direction going away from the base substrate, the first material layer and the third material layer being made of titanium (Ti), and the second material layer being made of aluminum (Al).

In a second aspect of the embodiments of the present disclosure, an array substrate is provided. The array substrate includes a base substrate, and a conductive pattern layer and an electrode pattern layer that are sequentially disposed on the base substrate along a direction going away from the base substrate, wherein the base substrate is provided with a display region and a peripheral region disposed around the display region, the conductive pattern layer includes a plurality of conductive structures disposed in the peripheral region, and the electrode pattern layer includes a plurality of electrodes disposed in the display region and protection structures disposed on the conductive structures.

In some embodiments, the conductive structure is provided with a first surface in contact with the base substrate, a second surface distal from the base substrate, and a side surface configured to connect the first surface and the second surface, wherein the protection structure at least covers part of the side surface.

In some embodiments, a mask layer is disposed on the electrode pattern layer, the mask layer includes electrode layer patterns disposed on the electrodes and protection patterns disposed on the protection structures.

In some embodiments, orthographic projections of the protection patterns onto the base substrate are overlapped with orthographic projections of the protection structures onto the base substrate.

In some embodiments, a surface, distal from the base substrate, of the conductive structure is a concave surface.

In some embodiments, the conductive pattern layer includes a first material layer, a second material layer and a third material layer that are sequentially stacked along a direction going away from the base substrate, wherein the first material layer and the third material layer are both made of Ti, and the second material layer is made of Al.

In some embodiments, the conductive pattern layer further includes a plurality of source electrodes and a plurality of drain electrodes that are all disposed in the display region, wherein the plurality of source electrodes are connected to the plurality of electrodes, or the plurality of drain electrodes are connected to the plurality of electrodes.

In some embodiments, the array substrate further includes a plurality of signal lines at least partially disposed in the peripheral region, wherein the conductive structures are disposed on the signal lines and in contact with the signal lines, and the signal line includes at least one of a data line, a gate line and a power line.

In some embodiments, the array substrate further includes an insulating layer disposed on the plurality of signal lines, wherein the insulating layer is provided with an opening for exposing the signal line, the opening extends along a direction in which the conductive structure extends; and the conductive structure is connected to the signal line via the opening.

In a third aspect of the embodiments of the present disclosure, a display panel is provided, the display panel includes the array substrate according to the second aspect.

In a fourth aspect of the embodiments of the present disclosure, an embodiment of the present disclosure further provides a display device including the display panel according to the third aspect.

BRIEF DESCRIPTION OF THE DRAWINGS

For clearer descriptions of the technical solutions in the embodiments of the present disclosure, the following briefly introduces the accompanying drawings required for describing the embodiments or the related art. Apparently, the accompanying drawings in the following description show merely some embodiments of the present disclosure, and those of ordinary skill in the art may still derive other drawings from these accompanying drawings without creative efforts.

DETAILED DESCRIPTION

For clear descriptions of the objectives, technical solutions and advantages of the present disclosure clearer, the embodiments of the present disclosure will be described in detail below in conjunction with the accompanying drawings.

Figure 1:
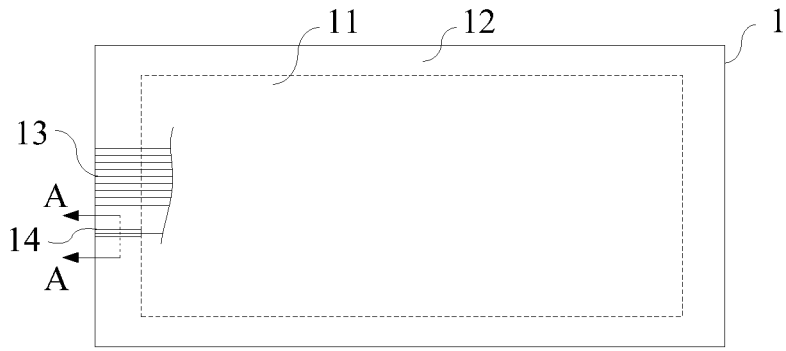
FIG. 1 is a top view of an array substrate in the related art.

FIG. 1 is a top view of an array substrate in the related art. As shown in FIG. 1, the array substrate includes a base substrate 1, and the base substrate 1 includes a display region 11 and a peripheral region 12 disposed around the display region 11. The display region 11 corresponds to a region, for displaying a screen, of a display panel. During manufacture of the display panel, the display region 11 is configured to receive a light-emitting unit, and the peripheral region 12 corresponds to a region outside the display region. A driving circuit is usually provided in the display region 11, and includes a plurality of signal lines 13, and part of the signal lines 13 extend from the display region 11 to the peripheral region 12. The signal lines 13 extending to the peripheral region 12 are configured to be connected to a flexible printed circuit board. Since the signal lines 13 are usually thinner and have higher resistance, which is not conducive to transmission of an electrical signal between the flexible printed circuit board and the driving circuit, conductive structures that are in contact with and cover the signal lines 13 are usually disposed in the peripheral region 12, and the signal lines may be connected to the flexible printed circuit board by the conductive structures.

Figure 2:
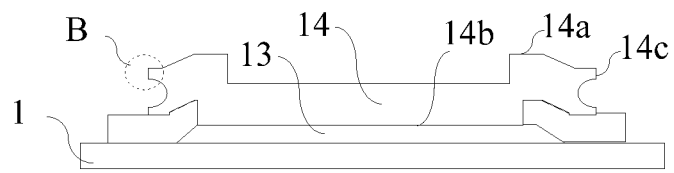
FIG. 2 is a sectional view of A-A in FIG. 1.

The conductive structures are usually conductive lines. FIG. 2 is a sectional view of A-A in FIG. 1. As shown in FIG. 2, the signal lines 13 are covered with conductive lines 14, and the conductive line 14 is provided with a first surface 14*a* in contact with the base substrate 1, a second surface 14*b* distal from the base substrate 1, and a side surface 14*c* configured to connect the first surface 14*a* and the second surface 14*b*. The first surface 14*a* being in contact with the base substrate 1 herein may mean that the first surface 14*a* is in direct contact with the base substrate 1, or indirect contact, i.e., there may be other hierarchical structures between the first surface 14*a* and the base substrate 1. Illustratively, in FIG. 2, the side surface 14*c* is perpendicular to the base substrate 1, and the side surface 14*c* may not be perpendicular to the base substrate 1. In order to facilitate the connection between the conductive lines 14 and the flexible printed circuit board, the conductive lines 14 are usually exposed, and thus may be easily corroded in the process of manufacturing the array substrate, resulting in adverse effects. For example, at least part of the conductive line is made of a material that is easily corroded by an etching solution for etching an anode. As shown in FIG. 2, the side surface of the conductive line 14 is severely corroded in the case that an anode of a subsequently fabricated OLED is etched with the etching solution, which will adversely affect the array substrate. Taking the corrosion form in FIG. 2 as an example, the region B in the figure may be tilted upon subsequent cleaning by high-pressure water, which adversely affects the connection between the conductive lines 14 and the flexible printed circuit board; and this region may also break and fall off, falling fragments may also cause a short circuit to the array substrate, in some embodiments, the anode of the OLED may be short-circuited in the case that the fragments fall to the display region.

Figure 3:
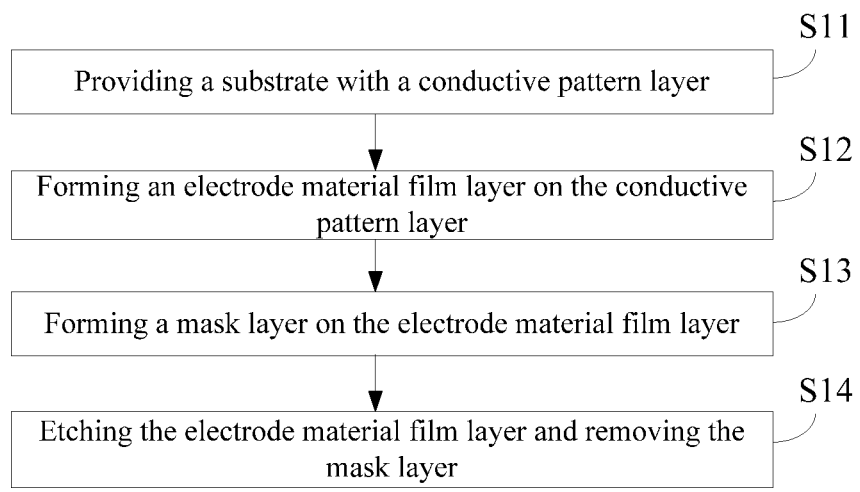
FIG. 3 is a flowchart of a method for manufacturing an array substrate according to an embodiment of the present disclosure.

FIG. 3 is a flowchart of a method for manufacturing an array substrate according to an embodiment of the present disclosure. As shown in FIG. 3, the method includes the following processes.

In S11, a base substrate provided with a conductive pattern layer is provided.

Figure 4:
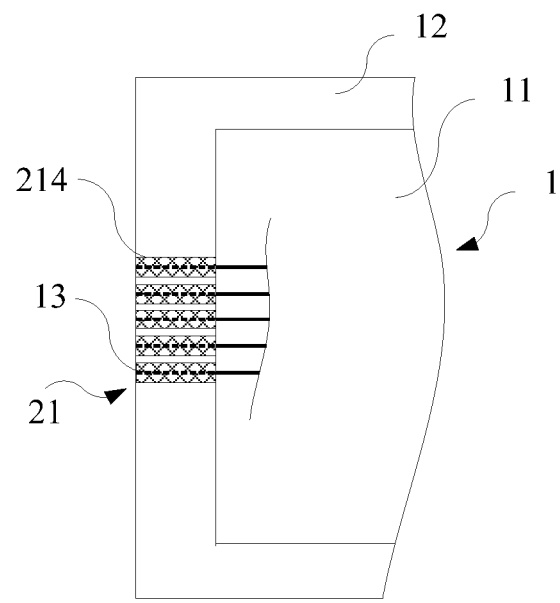
FIG. 4 is a partial structural diagram of a base substrate on which a conductive pattern layer is formed according to an embodiment of the present disclosure.

The base substrate is provided with a display region and a peripheral region disposed around the display region, the conductive pattern layer includes a plurality of conductive structures disposed in the peripheral region, and the conductive structure includes a first surface in contact with the base substrate, a second surface distal from the base substrate, and a side surface configured to connect the first surface and the second surface. In the present disclosure, a conductive line is taken as an example of the conductive structure for explanation. FIG. 4 is a partial structural diagram of a base substrate on which a conductive pattern layer is formed according to an embodiment of the present disclosure. As shown in FIG. 4, the conductive pattern layer 21 includes a plurality of conductive lines 214 disposed in the peripheral region 12.

In S12, an electrode material film layer is formed on the conductive pattern layer.

Figure 5:
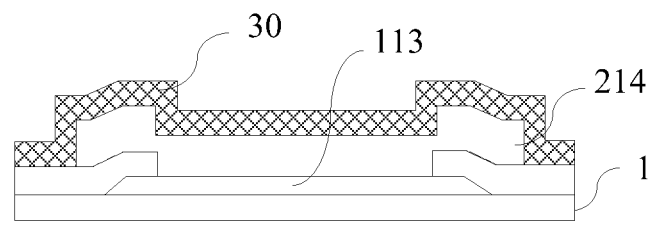
FIG. 5 is a schematic structural diagram of a base substrate on which an electrode material film layer is formed according to an embodiment of the present disclosure.

FIG. 5 is a schematic structural diagram of a base substrate on which an electrode material film layer is formed according to an embodiment of the present disclosure. As shown in FIG. 5, the electrode material film layer 30 is formed on the conductive pattern layer 21 and may be made of silver.

In S13, a mask layer is formed on the electrode material film layer.

Figure 6:
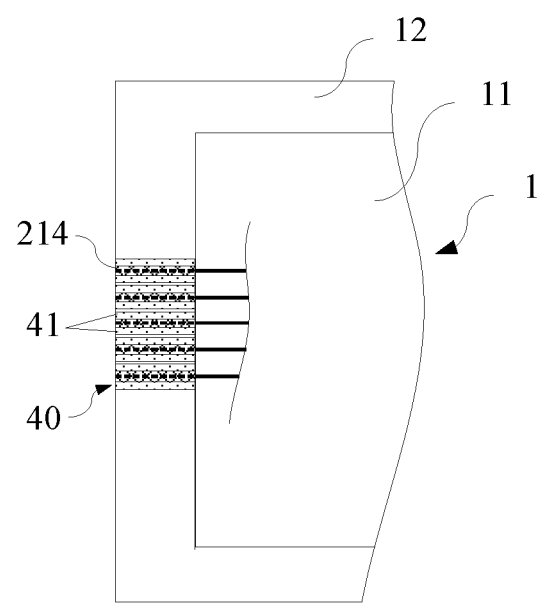
FIG. 6 is a schematic structural diagram of a base substrate on which a mask layer is formed according to an embodiment of the present disclosure.
Figure 7:
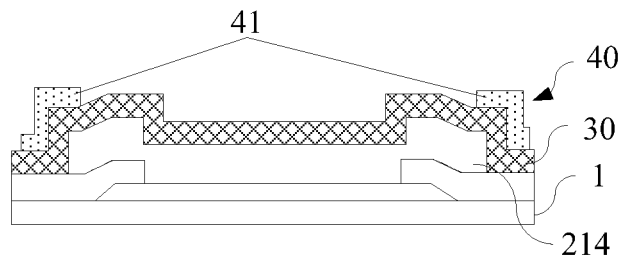
FIG. 7 is a partial sectional view of an array substrate according to an embodiment of the present disclosure.

FIG. 6 is a schematic structural diagram of a base substrate on which a mask layer is formed according to an embodiment of the present disclosure, the mask layer 40 includes a plurality of electrode layer patterns (not shown) disposed in the display region 11 and protection patterns 41 disposed above the conductive lines 214, and the protection patterns 41 at least cover part of the side surfaces of the conductive structures. As shown in FIG. 7, the conductive lines 214 are covered with the protective patterns 41. Each conductive line 214 may be correspondingly provided with one protection pattern 41, or only part of the conductive lines 214 may be correspondingly provided with the protection patterns 41, and the protection patterns 41 on the different conductive lines 214 are spaced to each other to ensure insulation between the conductive lines 214. The protection patterns 41 are configured to protect the conductive lines 214.

In S14, the electrode material film layer is etched and the mask layer is removed.

Figure 8:
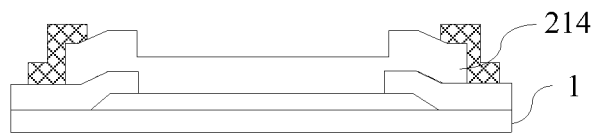
FIG. 8 is a schematic structural diagram of a base substrate on which an electrode material film layer is etched according to an embodiment of the present disclosure.

FIG. 8 is a schematic structural diagram of a base substrate from which an electrode material film layer is removed according to an embodiment of the present disclosure. Comparing FIG. 8 with FIG. 2, the side surfaces of the conductive lines 214 in FIG. 8 are not corroded. Although the protection patterns 41 are disposed on the electrode material film layer rather than in direct contact with the conductive lines 214, the protection patterns 41 protect the conductive lines 214.

The electrode material film layer is formed on the base substrate on which the conductive pattern layer is formed, then the mask layer is formed on the electrode material film layer, and the electrode material film layer is etched. In this case, since the conductive pattern layer disposed in the peripheral region includes a plurality of conductive structures, and the mask layer includes a plurality of electrode layer patterns disposed in the display region and the protection patterns disposed above the conductive structures, a plurality of electrodes may be acquired by means of etching under the action of the plurality of electrode layer patterns; and since the protection patterns at least cover part of the side surfaces of the conductive structures, under the action of the protection patterns, regions, shielded by the protection patterns, on the side surfaces of the conductive structures can be prevented from being corroded by the etching solution.

Figure 9:
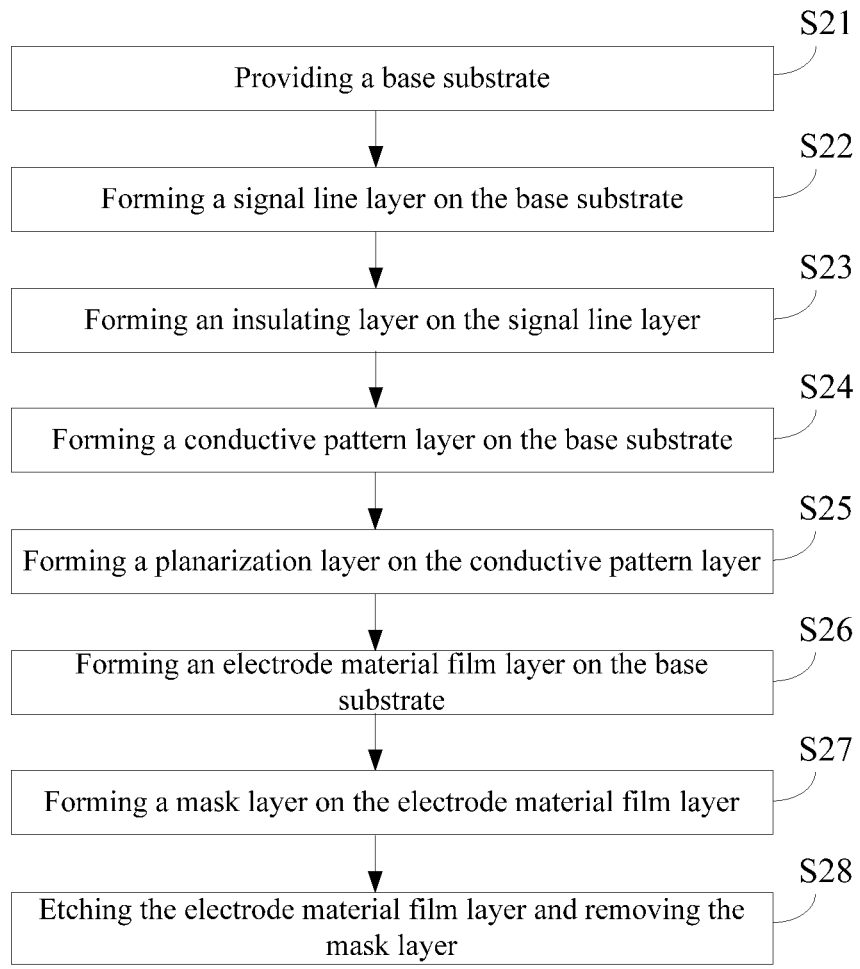
FIG. 9 is a flowchart of a method for manufacturing an array substrate according to an embodiment of the present disclosure.

FIG. 9 is a flowchart of a method for manufacturing an array substrate according to an embodiment of the present disclosure, the method includes the following processes.

In S21, a base substrate is provided.

The base substrate is provided with a display region and a peripheral region disposed around the display region. The display region is configured to receive an OLED unit in the subsequent process.

The base substrate may be a glass substrate, a quartz substrate, a plastic substrate, etc.

In S22, a signal line layer is formed on the base substrate.

Figure 10:
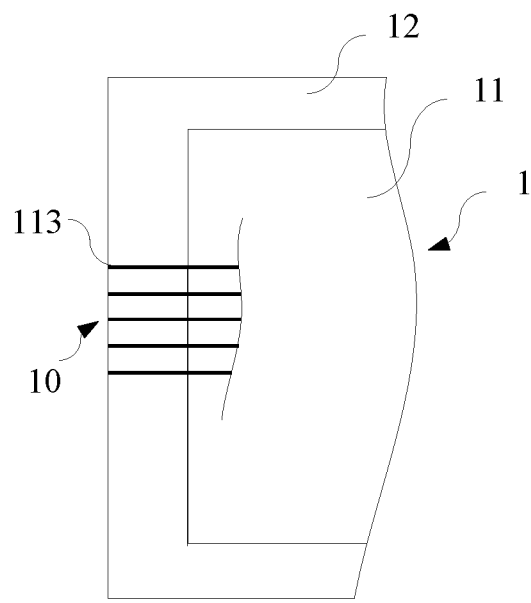
FIG. 10 is a schematic structural diagram of a base substrate on which a signal line layer is formed according to an embodiment of the present disclosure.

FIG. 10 is a schematic structural diagram of a base substrate on which a signal line layer is formed according to an embodiment of the present disclosure. As shown in FIG. 10, the signal line layer 10 may include a plurality of signal lines 113, wherein the plurality of signal lines 113 may be at least partially disposed in the peripheral region 12. Part of the signal lines 113 may be disposed in the display region 11 and the peripheral region 12, and part of the signal lines 113 may extend from the display region 11 to the peripheral region 12. The signal line 113 may include at least one of a data line, a gate line, and a power line.

Taking the signal line 113 as a gate line as an example, the gate line extends from the display region 11 to the peripheral region 12, which facilitates the connection between the gate line and a flexible printed circuit board. In this way, in the case that the array substrate is made into a display panel, the flexible printed circuit board may transmit a scanning signal to the display panel by the gate line.

In S23, an insulating layer is formed on the signal line layer.

The insulating layer covers the signal line layer, and may provide a necessary insulation and provide a foundation for the subsequent structure fabrication.

Figure 11:
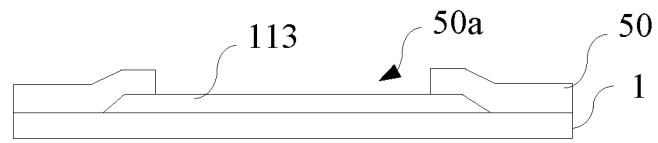
FIG. 11 is a schematic structural diagram of a base substrate on which an insulating layer is formed according to an embodiment of the present disclosure.

FIG. 11 is a schematic structural diagram of a base substrate on which an insulating layer is formed according to an embodiment of the present disclosure, as shown in FIG. 11, in the peripheral region 12, the insulating layer 50 is provided with an opening 50a for exposing the signal line 113. The opening 50a extends along a conductive line 214. In the peripheral region 12, by removing part, disposed above the signal line 113, of the insulating layer 50, the signal line 113 is exposed, which facilitates the contact between the signal line 113 and the subsequently fabricated conductive line 214.

In S24, a conductive pattern layer is formed on the base substrate.

Figure 12:
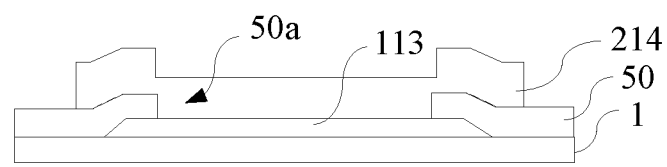
FIG. 12 is a schematic structural diagram of a base substrate on which a conductive pattern layer is formed according to an embodiment of the present disclosure.

FIG. 12 is a schematic structural diagram of a base substrate on which a conductive pattern layer is formed according to an embodiment of the present disclosure. The conductive pattern layer 21 may include a plurality of conductive lines 214 disposed in the peripheral region 12. As shown in FIG. 12, in the peripheral region 12, the conductive lines 214 are disposed inside the opening 50a, and connected to the signal lines 113 via the opening 50a. The conductive lines 214 are in contact with and cover the signal lines 113, and may be connected to the flexible printed circuit board.

In some embodiments, a material of the conductive pattern layer may be Ti/Al/Ti, i.e., the conductive pattern layer may include a first material layer, a second material layer and a third material layer that are sequentially stacked along a direction going away from the base substrate 1. The first material layer and the third material layer are both made of Ti, and the second material layer is made of Al. Ti has an excellent corrosion resistance, and Al has an excellent electrical conductivity. With a stacked structure of Ti/Al/Ti, Ti may be used to protect Al, which is conducive to reducing corrosion of Al during production.

Figure 13:
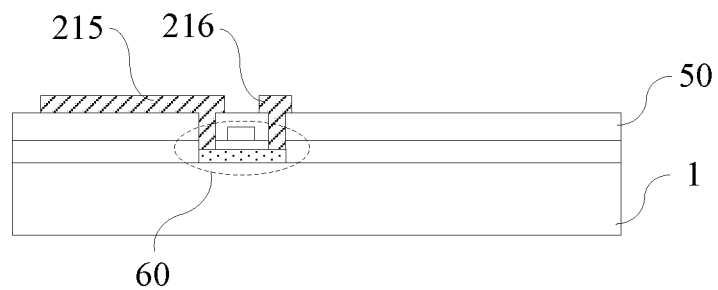
FIG. 13 is a partial sectional view of an array substrate in a display region according to an embodiment of the present disclosure.

FIG. 13 is a partial sectional view of an array substrate in a display region according to an embodiment of the present disclosure. As shown in FIG. 13, the conductive pattern layer 21 may further include a plurality of source electrodes 215 and a plurality of drain electrodes 216 that are all disposed in the display region 11. Thin-film transistors (TFTs) 60 may be further distributed in the display region 11 in an array, wherein the TFTs 60 may be configured to control the OLED unit manufactured in the subsequent process to emit light. By manufacturing the conductive pattern layer 21, the source electrodes 215 and the drain electrodes 216 of the TFTs 60 are formed in the display region 11, and one of the source electrode 215 and the drain electrode 216 may be connected to an electrode of the OLED unit manufactured in the subsequent process. For example, the drain electrode 216 may be connected to an anode of the OLED unit.

By disposing the conductive lines 214, the source electrodes 215 and the drain electrodes 216 in the same layer, it is manufactured by only a one-time patterning process, which is conducive to simplifying the process and improving the production efficiency.

The conductive pattern layer may be manufactured in the following way.

A metal layer is formed on the base substrate.

The conductive pattern layer is acquired by patterning the metal layer.

In S25, a planarization layer is formed on the conductive pattern layer.

Figure 14:
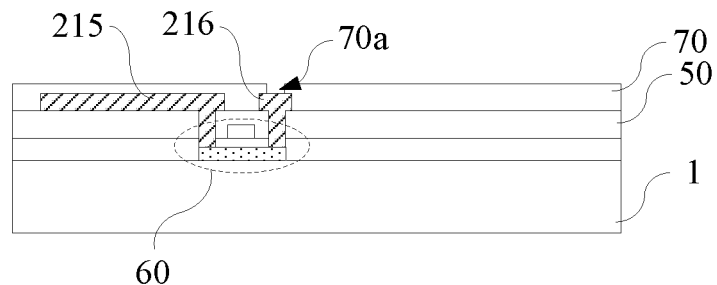
FIG. 14 is a schematic structural diagram of a base substrate on which a planarization layer is formed according to an embodiment of the present disclosure.

FIG. 14 is a schematic structural diagram of a base substrate on which a planarization layer is formed according to an embodiment of the present disclosure. The planarization layer may provide a smooth surface in the display region 11, which is beneficial to subsequent fabrication of the OLED unit. As shown in FIG. 14, the planarization layer 70 may be provided with a via hole 70a, such that the electrode of the OLED unit may be connected to the source electrode 215 or the drain electrode 216. A portion of the planarization layer 70 disposed in the peripheral region 12 is removed to ensure that the conductive lines 214 are exposed outside.

In S26, an electrode material film layer is formed on the base substrate.

The electrode material film layer may be configured to make the electrode of the OLED unit. The present disclosure takes manufacture of the anode of the OLED unit as an example.

Figure 15:
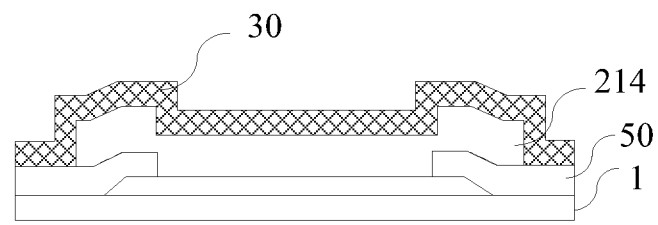
FIG. 15 is a schematic structural diagram of a base substrate on which an electrode material film layer is formed according to an embodiment of the present disclosure.

The electrode material film layer formed in S26 may cover the display region and the peripheral region. FIG. 15 is a schematic structural diagram of a base substrate on which an electrode material film layer is formed according to an embodiment of the present disclosure. As shown in FIG. 15, the electrode material film layer 30 covers the conductive lines 214.

In S27, a mask layer is formed on the electrode material film layer.

The mask layer may include a plurality of electrode layer patterns disposed in the display region and a plurality of protection patterns disposed above the conductive lines. The protection patterns may be in one-to-one correspondence with the conductive lines, or may be only provided on part of the conductive lines.

The electrode layer patterns are configured to manufacture the electrode of the OLED unit in the display region, and the protection patterns are configured to protect the conductive lines during the electrode material film layer is etched.

Figure 16:
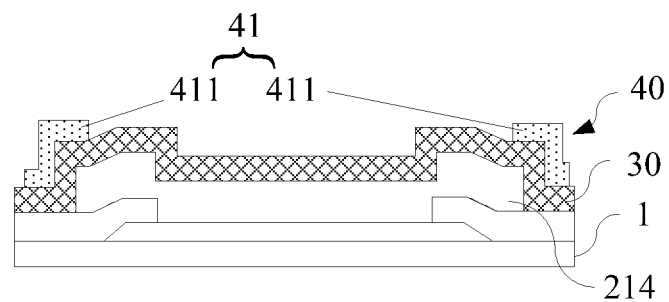
FIG. 16 is a schematic structural diagram of a base substrate on which protection patterns are formed according to an embodiment of the present disclosure.

A plurality of protection patterns are formed in the peripheral region, wherein the protection patterns at least cover part of the side surfaces of the conductive lines. FIG. 16 is a schematic structural diagram of a base substrate on which protection patterns are formed according to an embodiment of the present disclosure. As shown in FIG. 16, the protective patterns 41 may cover the side surfaces of the conductive lines 214.

The protection pattern 41 may include a side protection block 411, wherein an orthographic projection of the side surface of the conductive line 214 onto the base substrate 1 is within an orthographic projection of the side protection block 411 onto the base substrate 1. That is, the side protection block 411 covers a region, disposed on the side surface of the conductive line 214, of the electrode material film layer 30. In this way, owing to the side protection block 411, the region, covered with the side protection block 411, on the electrode material film layer 30 covered with the side protection block 411 may not be etched in the case that the electrode material film layer is etched, such that the etching solution is not in contact with the side surface of the conductive line 214, thus causing no corrosion to the side surface of the conductive line 214. For the conductive line 214 made of Ti/Al/Ti, Al exposed on the side surface may be easily corroded. However, by protecting the side surface of the conductive line 214 using the side protection block 411, the conductive line 214 can be well protected against corrosion.

The mask layer 40 may be formed in the following way.

A photoresist layer is formed on the electrode material film layer 30.

A mask layer 40 is formed by patterning the photoresist layer.

In the related art, it is also necessary to provide a mask layer for manufacturing the electrode of the OLED unit, and the mask layer only includes the electrode layer patterns disposed in the display region. However, since the mask layer is only changed in S27, and by a one-time patterning process, the electrode layer patterns are formed in the display region and the protection patterns are formed in the peripheral region, no process is added. Therefore, the operation is simple, and the production cost is less affected.

In S28, the electrode material film layer is etched and the mask layer is removed.

The electrode material film may be etched with an acid etching solution.

Figure 17:
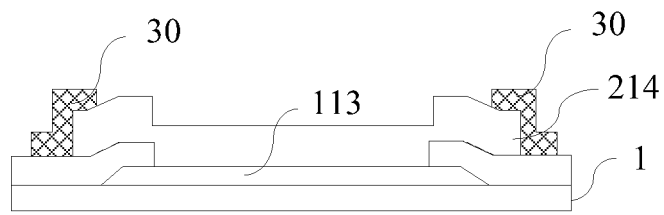
FIG. 17 is a schematic structural diagram of a base substrate from which a mask layer is removed according to an embodiment of the present disclosure.

FIG. 17 is a schematic structural diagram of a base substrate from which a mask layer is removed according to an embodiment of the present disclosure. As shown in FIG. 17, in the case that the electrode material film layer 30 is etched and the mask layer 40 is removed, the region, covered with the side protection block 411, of the electrode material film layer 30 may remain on the conductive lines 214. Since the electrode material film layer 30 is a conductive structure, the electrode material film layer 30 remaining on the conductive lines 214 will not adversely affect the connection between the conductive lines 214 and the flexible printed circuit board.

Figure 18:
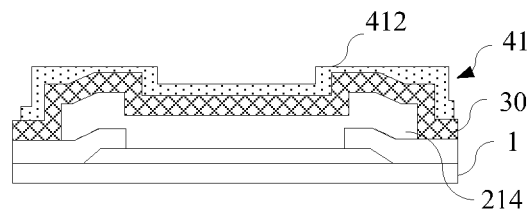
FIG. 18 is a schematic diagram of a base substrate on which a mask layer is formed according to an embodiment of the present disclosure.

The specific structures of the protection patterns may be set according to the regions to be protected of the conductive lines. In some embodiments, in FIG. 17, in order to protect the side surfaces of the conductive lines 214, the protection patterns 41 cover the side surfaces of the conductive lines 214. FIG. 18 is a schematic diagram of a base substrate on which a mask layer is formed according to an embodiment of the present disclosure. As shown in FIG. 18, in order to protect the side surfaces of the conductive lines 214 and surfaces of the conductive lines 214 distal from the base substrate 1, the protection patterns 41 may cover the side surfaces of the conductive lines 214 and the surfaces, distal from the base substrate 1, of the conductive lines 214.

The protection pattern 41 may include a surface protection block 412. Orthographic projections of the conductive lines 214 onto the base substrate 1 are within orthographic projections of the surface protection blocks 412 onto the base substrate 1, i.e., the surface protection blocks 412 cover regions, disposed on the side surfaces of the conductive lines 214 and on the surfaces, distal from the base substrate 1, of the conductive lines 214, of the electrode material film layer 30. In this way, during the process of etching the electrode material film layer 30, neither the side surfaces of the conductive lines 214 nor the surfaces, distal from the base substrate 1, of the conductive lines 214 will be in contact with the etching solution.

Figure 19:
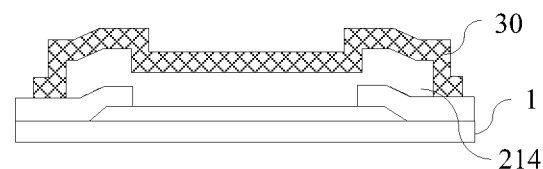
FIG. 19 is a schematic structural diagram of a base substrate from which a mask layer is removed according to an embodiment of the present disclosure.

FIG. 19 is a schematic structural diagram of a base substrate from which a mask layer is removed according to an embodiment of the present disclosure. As shown in FIG. 19, in the case that the electrode material film layer 30 is etched and the mask layer 40 is removed, the region, covered with the surface protection block 412, on the electrode material film layer 30 may remain on the conductive lines 214. Since the electrode material film layer 30 is a conductive structure, the electrode material film layer 30 remaining on the conductive lines 214 may not adversely affect the connection between the conductive lines 214 and the flexible printed circuit board. In addition, since the remaining electrode material film layer 30 is in contact with the side surfaces of the conductive lines 214 and the surfaces, distal from the base substrate 1, of the conductive lines 214, the area of contact is larger. Therefore, the electrode material film layer 30 is less likely to fall off, and the risk of adverse effects caused by falling off of the remaining electrode material film layer 30 is reduced.

Figure 20:
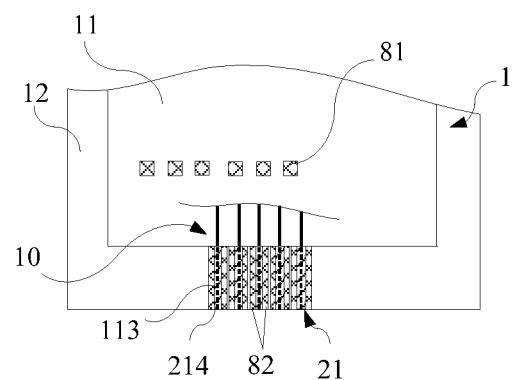
FIG. 20 is a partial structural diagram of an array substrate according to an embodiment of the present disclosure.

FIG. 20 is a partial structural diagram of an array substrate according to an embodiment of the present disclosure, and the array substrate is manufactured by the method shown in FIG. 3 or FIG. 9. As shown in FIG. 20, the array substrate includes a base substrate 1, and a conductive pattern layer 21 and an electrode pattern layer that are sequentially disposed on the base substrate 1 along a direction going away from the base substrate 1. The base substrate 1 includes a display region 11 and a peripheral region 12 disposed around the display region 11, the conductive pattern layer 21 includes a plurality of conductive structures disposed in the peripheral region 12, and the electrode pattern layer includes a plurality of electrodes 81 disposed in the display region 11 and protection structures 82 disposed on the conductive structures.

The conductive structures may be conductive lines 214. In the present disclosure, the conductive line 214 is taken as an example of the conductive structure for explanation, the protection structures 82 may be in one-to-one correspondence with the conductive lines 214, the protection structures 82 are disposed on the corresponding conductive lines 214, or only part of the conductive lines 214 are disposed with the protection structures 82. The protection structures 82 may cover at least part of side surfaces of the conductive lines 214. Six electrodes 81 are exemplarily shown in FIG. 20. The protection structure 82 is an electrode material film layer remaining on the conductive line under the action of the protection patterns in the case that a display panel is manufactured by the method shown in FIG. 3 or FIG. 9. The electrode material film layer may be made of silver. The electrode material film layer is formed on the base substrate on which the conductive pattern layer is formed, then a mask layer is formed on the electrode material film layer, and the electrode material film layer is etched. In this case, since the conductive pattern layer disposed in the peripheral region includes a plurality of conductive lines, and the mask layer includes a plurality of electrode layer patterns disposed in the display region and the protection patterns disposed above the conductive lines, a plurality of electrodes may be acquired by means of etching under the action of the plurality of electrode layer patterns, and regions on the conductive lines shielded by the protection patterns can be prevented from being corroded by an etching solution under the action of the protection patterns.

A mask layer may be disposed on the electrode pattern layer, wherein the mask layer 40 may include electrode layer patterns disposed on the electrodes 81 and protection patterns 41 disposed on the protection structures 82.

Exemplarily, the mask layer 40 may be a photoresist layer.

The electrode layer patterns may be in one-to-one correspondence with the electrodes 81, the protection patterns 41 may be in one-to-one correspondence with the protection structures 82, or only part of the protection structures 82 may be provided with the protection patterns 41.

Figure 21:
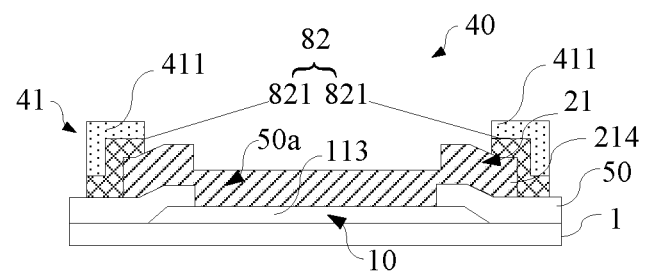
FIG. 21 is a partial sectional view of an array substrate in a peripheral region according to an embodiment of the present disclosure.

Orthographic projections of the protection patterns onto the base substrate may be overlapped with orthographic projections of the protection structures onto the base substrate. FIG. 21 is a partial sectional view of an array substrate in a peripheral region according to an embodiment of the present disclosure. As shown in FIG. 12, the protection structure 82 may include a first conductive layer 821, wherein an orthographic projection of a side surface of the conductive line 214 onto the base substrate 1 is within an orthographic projection of the first conductive layer 821 onto the base substrate 1, i.e., the protection structure 82 may include the first conductive layer 821 covering the side surface of the conductive line 214. In the case that the protection pattern 41 includes a side protection block 411, the side protection block 411 covers a region, disposed on the side surface of the conductive line 214, of the electrode material film layer 30. In this way, owing to the side protection block 411, the region, covered with the side protection block 411, of the electrode material film layer may not be etched w % ben the electrode material film layer is etched, and the etching solution is not in contact with the side surface of the conductive line 214, thus causing no corrosion to the side surface of the conductive line 214. In the case that the electrode material film layer is etched, the first conductive layer 821 covering the side surface of the conductive line 214 may be formed under the action of the side protection block 411.

As shown in FIG. 21, a surface, distal from the base substrate 1, of the conductive line 214 may be a concave surface. The conductive line 214 is configured to be connected to a flexible printed circuit board. Configuring the surface, distal from the base substrate 1, of the conductive line 214 as the concave surface may be conducive to increasing the area of contact between the conductive line 214 and the flexible printed circuit board and achieving a firmer connection therebetween, and also conducive to reducing the resistance.

In some embodiments, a material of the conductive line 214 may be Ti/Al/Ti. i.e., the conductive line 214 includes a first material layer, a second material layer and a third material layer that are sequentially stacked along a direction going away from the base substrate 1. The first material layer and the third material layer are both made of Ti, and the second material layer is made of Al. Ti has an excellent corrosion resistance, and Al has an excellent electrical conductivity. With a stacked structure of Ti/Al/Ti, Ti may be used to protect Al, which is conducive to reducing the corrosion of Al during production.

Figure 22:
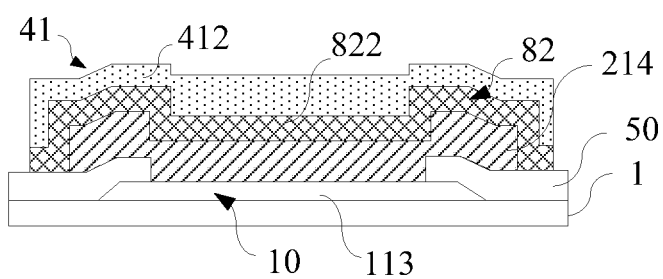
FIG. 22 is a partial sectional view of an array substrate in a peripheral region according to an embodiment of the present disclosure.

FIG. 22 is a local sectional view of an array substrate in a peripheral region according to an embodiment of the present disclosure, and the array substrate is also manufactured by the method shown in FIG. 3 or FIG. 9. As shown in FIG. 22, in the array substrate, the protection structure 82 may include a second conductive layer 822, and an orthographic projection of the conductive line 214 onto the base substrate 1 is within an orthographic projection of the second conductive layer 822 onto the base substrate 1, i.e., the second conductive layer 822 covers the side surface of the conductive line 214 and the surface, distal from the base substrate 1, of the conductive line 214. In the case that the protection pattern 41 includes a surface protection block 412, the surface protection block 412 covers regions of the electrode material film layer disposed on the side surface of the conductive line 214 and the surface, distal from the base substrate 1, of the conductive line 214. In this way, owing to the surface protection block 412, the region, covered with the surface protection block 412, of the electrode material film layer may not be etched in the case that the electrode material film layer is etched, and the etching solution will touch neither the side surface of the conductive line 214 nor the surface, distal from the base substrate 1, of the conductive line 214, thus causing no corrosion to the conductive line 214. In the case that the electrode material film layer is etched, under the action of the surface protection block 412, the second conductive layer 822 may be formed for covering the side surface of the conductive line 214 and the surface, distal from the base substrate 1, of the conductive line 214. In addition, since the second conductive layer 822 is in contact with both of the side surface of the conductive line 214 and the surface, distal from the base substrate 1, of the conductive line 214, the area of contact is larger. Therefore, the second conductive layer is less likely to fall off, and the risk of adverse effects caused by falling off of the second conductive layer 822 is reduced.

Referring to FIG. 20, the array substrate may further include a plurality of signal lines 113 at least partially disposed in the peripheral region 12, and the conductive lines 214 are disposed on the signal lines 113 and in contact with the signal lines 113.

A signal line layer 10 may be provided on the array substrate, and the signal line layer 10 is disposed on the base substrate 1. The signal line layer 10 may include a plurality of signal lines 113, and part of the signal lines 113 may extend from the display region 11 to the peripheral region 12. As shown in FIG. 21, the conductive pattern layer 21 is disposed on the signal line layer 10, and in the peripheral region, the conductive lines 214 are in contact with the signal lines 113 and cover the signal lines 113. The signal line 113 may include at least one of a data line, a gate line and a power line. Taking the signal line 113 as a gate line as an example, the gate line extends from the display region 11 to the peripheral region 12, which facilitates the connection between the gate line and a flexible printed circuit board. In this way, in the case that the array substrate is made into a display panel, the flexible printed circuit board may transmit a scanning signal to the display panel by the gate line.

As shown in FIG. 21, the array substrate may further include an insulating layer 50 disposed on the signal line layer 10. In the peripheral region 12, the insulating layer 50 is provided with an opening 50a for exposing the signal lines 113. The opening 50a extends along a direction in which the conductive lines 214 extend. The conductive lines 214 are disposed in the opening 50a and connected to the signal lines 113 via the opening 50a. The signal lines 113 are exposed outside via the opening 50a, such that the conductive lines 214 may be in contact with the signal lines 113.

Figure 23:
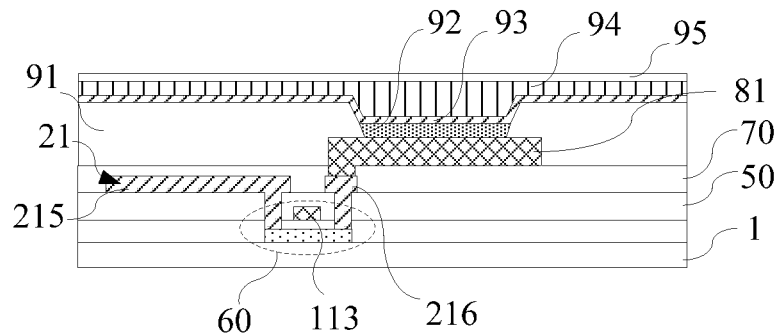
FIG. 23 is a partial sectional view of an array substrate in a display region according to an embodiment of the present disclosure.

FIG. 23 is a partial sectional view of an array substrate in a display region according to an embodiment of the present disclosure. As shown in FIG. 23, the conductive pattern layer 21 may further include a plurality of source electrodes 215 and a plurality of drain electrodes 216 that are all disposed in the display region 11, wherein the plurality of drain electrodes 216 are connected to the plurality of electrodes 81. By the drain electrodes 216, electrical signals may be provided to the electrodes 81 of the OLED unit, such that the OLED unit emits light. By disposing the conductive lines 214, the source electrodes 215, and the drain electrodes 216 in the same layer, the conductive pattern layer 21 is manufactured by only a one-time patterning process, which is beneficial to save the process and improve the production efficiency.

In other possible embodiments, the plurality of source electrodes 215 may also be connected to the plurality of electrodes. That is, one of the source electrode 215 and the drain electrode 216 may be connected to the electrode 81.

As shown in FIG. 23, the array substrate may further include a pixel definition layer 91, an organic material functional layer 92 and an electrode 93, the pixel definition layer 91, the organic material functional layer 92 and the electrode 93 are disposed on the electrode 81. The electrode 93 may be a cathode in the case that the electrode 81 is an anode, and the electrode 93 may be an anode in the case that the electrode 81 is a cathode. The electrode 93 may also be provided with a passivation layer 94 and an encapsulation layer 95.

An embodiment of the present disclosure further provides a display panel. The display panel may include the array substrate as shown in FIGS. 20 to 23.

An embodiment of the present disclosure also provides a display device. The display device may include the aforementioned display panel. Exemplarily, the display device may be any product or component having a display function, for example, a mobile phone, a tablet computer, a TV, a display, a notebook computer, a digital photo frame, a navigator, or the like.

Described above are merely exemplary embodiments of the present disclosure, and are not intended to limit the present disclosure. Within the spirit and principles of the disclosure, any modifications, equivalent substitutions, improvements, and the like are within the protection scope of the present disclosure.

What is claimed is:

1. An array substrate, comprising a base substrate, and a conductive pattern layer and an electrode pattern layer that are sequentially disposed on the base substrate along a direction going away from the base substrate, wherein the base substrate is provided with a display region and a peripheral region disposed around the display region, the conductive pattern layer comprises a plurality of conductive structures disposed in the peripheral region, and the electrode pattern layer comprises a plurality of electrodes disposed in the display region and protection structures disposed on the conductive structures, wherein a mask layer is disposed on the electrode pattern layer and comprises electrode layer patterns disposed on the electrodes and protection patterns disposed on the protection structures.

2. The array substrate according to claim 1, wherein the conductive structure is provided with a first surface in contact with the base substrate, a second surface distal from the base substrate, and a side surface configured to connect the first surface and the second surface, wherein the protection structure at least covers part of the side surface.

3. The array substrate according to claim 2, wherein a surface, distal from the base substrate, of the conductive structure is a concave surface.

4. The array substrate according to claim 2, wherein the conductive pattern layer comprises a first material layer, a second material layer and a third material layer that are sequentially stacked along a direction going away from the base substrate, wherein the first material layer and the third material layer are both made of Ti, and the second material layer is made of Al.

5. The array substrate according to claim 2, wherein the conductive pattern layer further comprises a plurality of source electrodes and a plurality of drain electrodes that are all disposed in the display region, wherein the plurality of source electrodes are connected to the plurality of electrodes, or the plurality of drain electrodes are connected to the plurality of electrodes.

6. The array substrate according to claim 2, further comprising a plurality of signal lines at least partially disposed in the peripheral region, wherein the conductive structures are disposed on the signal lines and in contact with the signal lines, and the signal line comprises at least one of a data line, a gate line and a power line.

7. The array substrate according to claim 6, further comprising an insulating layer disposed on the plurality of signal lines, wherein the insulating layer is provided with an opening for exposing the signal line, wherein the opening extends along a direction in which the conductive structure extends, and the conductive structure is connected to the signal line via the opening.

8. The array substrate according to claim 1, wherein orthographic projections of the protection patterns onto the base substrate are overlapped with orthographic projections of the protection structures onto the base substrate.

9. The array substrate according to claim 1, wherein a surface, distal from the base substrate, of the conductive structure is a concave surface.

10. The array substrate according to claim 1, wherein the conductive pattern layer comprises a first material layer, a second material layer and a third material layer that are sequentially stacked along a direction going away from the base substrate, wherein the first material layer and the third material layer are both made of Ti, and the second material layer is made of Al.

11. The array substrate according to claim 1, wherein the conductive pattern layer further comprises a plurality of source electrodes and a plurality of drain electrodes that are all disposed in the display region, wherein the plurality of source electrodes are connected to the plurality of electrodes, or the plurality of drain electrodes are connected to the plurality of electrodes.

12. The array substrate according to claim 1, further comprising a plurality of signal lines at least partially disposed in the peripheral region, wherein the conductive structures are disposed on the signal lines and in contact with the signal lines, and the signal line comprises at least one of a data line, a gate line and a power line.

13. The array substrate according to claim 12, further comprising an insulating layer disposed on the plurality of signal lines, wherein the insulating layer is provided with an opening for exposing the signal line, wherein the opening extends along a direction in which the conductive structure extends, and the conductive structure is connected to the signal line via the opening.

14. A display panel, comprising the array substrate as defined in claim 1.

15. A display device, comprising the display panel as defined in claim 14.

* * * * *